(12) United States Patent
Nilsson (10) Patent No.: US 10,924,122 B2
(45) Date of Patent: Feb. 16, 2021

(54) METHOD AND SYSTEM FOR PHASE ALIGNMENT OF MULTIPLE PHASED LOCKED LOOPS

(71) Applicant: Telefonaktiebolaget LM Ericsson (publ), Stockholm (SE)

(72) Inventor: Magnus Nilsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 79 days.

(21) Appl. No.: 16/307,172

(22) PCT Filed: Jun. 22, 2016

(86) PCT No.: PCT/EP2016/064407
§ 371 (c)(1),
(2) Date: Dec. 5, 2018

(87) PCT Pub. No.: WO2017/220138
PCT Pub. Date: Dec. 28, 2017

(65) Prior Publication Data
US 2019/0131979 A1 May 2, 2019

(51) Int. Cl.
*H03L 7/087* (2006.01)
*G06F 1/04* (2006.01)
(Continued)

(52) U.S. Cl.
CPC .............. *H03L 7/087* (2013.01); *G06F 1/04* (2013.01); *H03L 7/23* (2013.01); *H04B 1/40* (2013.01)

(58) Field of Classification Search
CPC ......... H03L 7/07; H03L 7/0805; H03L 7/087; H03L 7/089; H03L 7/091; H03L 7/099;
(Continued)

(56) References Cited

U.S. PATENT DOCUMENTS 5,391,996 A  2/1995  Marz
5,950,115 A * 9/1999  Momtaz ............... H03L 7/14
                                                  455/73

(Continued)

FOREIGN PATENT DOCUMENTS

EP      2843839 A1    3/2015
WO   2007094622 A1    8/2007

*Primary Examiner* — Yuwen Pan
*Assistant Examiner* — Paul P Tran
(74) *Attorney, Agent, or Firm* — Coats & Bennett, PLLC (57) ABSTRACT

A system and method for phase alignment of multiple PLLs are disclosed. The system comprises a plurality N of PLLs (PLL_1 . . . PLL_N) and a plurality N of phase detectors (DET_1 . . . DET_N). The plurality N of phase detectors and the plurality N of PLLs are connected in a loop such that an i-th phase detector (DET_i) is configured to receive an i-th feedback signal (FB_i) generated from the i-th PLL and an (i+1)-th feedback signal (FB_i+1) generated from the (i+1)-th PLL, and the N-th phase detector (DET_N) is configured to receive the first feedback signal (FB_1) generated from the first PLL and the N-th feedback signal (FB_N) generated from the N-th PLL. The an i-th phase detector (DET_i) is configured to generate an i-th adjustment signal indicating an i-th phase difference between the i-th and (i+1)-th feedback signals for adjusting a phase of the i-th or (i+1)-th PLL, wherein i=1, 2, 3, . . . N−1. The N-th phase detector (DET_N) is configured to generate a N-th adjustment signal indicating a N-th phase difference between the first and N-th feedback signals.

16 Claims, 7 Drawing Sheets

(51) Int. Cl.
*H04B 1/40* (2015.01)
*H03L 7/23* (2006.01)

(58) Field of Classification Search
CPC ......... H03L 7/1976; H03L 7/23; H03L 7/235;
H03M 1/1255; G06F 1/04; G06F 1/12;
G04F 10/005; H04B 1/40; H04J 3/0688;
H04L 7/0331
USPC ........................................................ 455/260
See application file for complete search history.

(56) References Cited

U.S. PATENT DOCUMENTS

| | | | |
|---|---|---|---|
| 8,415,999 B2* | 4/2013 | Ding | H03L 7/08 |
| | | | 327/157 |
| 9,225,507 B1 | 12/2015 | Lye et al. | |
| 9,246,498 B2* | 1/2016 | Shimura | H03L 7/23 |
| 9,306,730 B1* | 4/2016 | Shu | H03L 7/1974 |
| 2001/0043098 A1* | 11/2001 | Locker | H03L 7/07 |
| | | | 327/156 |
| 2002/0167857 A1 | 11/2002 | Magoshi | |
| 2002/0171412 A1* | 11/2002 | Lenk | H03L 7/07 |
| | | | 324/76.53 |
| 2009/0086875 A1* | 4/2009 | Shao | H03L 7/197 |
| | | | 375/376 |
| 2009/0273517 A1 | 11/2009 | Thiesen et al. | |
| 2014/0242914 A1 | 8/2014 | Monroe | |
| 2015/0084676 A1* | 3/2015 | McLaurin | H03L 7/23 |
| | | | 327/142 |
| 2016/0301417 A1* | 10/2016 | Mitric | H03L 7/0991 |
| 2016/0336923 A1* | 11/2016 | Seedher | H03L 7/1976 |
| 2017/0324419 A1* | 11/2017 | Mayer | C23C 16/4401 |

* cited by examiner

METHOD AND SYSTEM FOR PHASE ALIGNMENT OF MULTIPLE PHASED LOCKED LOOPS

TECHNICAL FIELD

Embodiments herein relate to a system and method therein for phase alignment of multiple Phased Locked Loops, PLLs. In particular, they relate to phase alignment of a plurality N of PLLs comprised in Radio Frequency Integrated Circuits, RFICs, in a communication device, such as a beamforming base station.

BACKGROUND

Wireless communication systems usually comprise transceivers which comprise receivers and transmitters. The transmitters typically up-convert baseband signals to Radio Frequency (RF) signals for transmission, and the receivers down-convert received RF signals to baseband signals for processing. Such frequency conversion requires producing reliable mixing frequency signals, typically referred to as local oscillator (LO) signals, for use in an RFIC in a wireless communication device. PLLs are often used to provide such mixing frequency signals.

It is foreseeable that 5G cellular systems will use millimeter waves, where the frequencies currently in discussion range between 15 GHz and 60 GHz. In order to use such 5G system outdoors, a longer cyclic prefix, which is used as a guard band between symbols, has to be used compared to newly released 60 GHz indoor systems. Such longer cyclic prefixes necessitate a closer sub-carrier spacing in the Orthogonal Frequency Division Multiplexing (OFDM) modulation. This closer sub-carrier spacing poses stringent phase noise requirements on the output of the PLLs. At the same time, beamforming should be supported to increase the range and capacity of the system, which results in a large number of antenna elements. The signal at each antenna element of a beamforming system will have an individual phase shift that controls the beam and in particular the beam direction. In some implementations, the beam controlling phase shifts are imposed on the local oscillator signal generated by the PLL. In any event, accurate phase shifts are required to provide accurate beamforming. It is also desirable to be able to program the frequency of the local oscillator signal to enable the wireless communication device to operate on different frequency channels and in different bands.

Digital beamforming requires one digital data stream per antenna used and thus a full transceiver (TRX) chain. If a beamforming base station uses in an order of 100 antennas, one RFIC normally does not contain all TRX chains. If designing a system at high frequencies, e.g. higher than 2 GHz, it is not practical to distribute a local oscillator signal in between the RFICs. It is more straight forward to use separate PLLs for each RFIC and distribute a PLL reference clock signal to each RFIC. Also inside one RFIC, the LO signals distribution might be more costly than having separate PLLs for each transceiver, especially at micro- or millimeter-wave (MMW) frequencies, i.e. 24 GHz or higher.

Another benefit in having a separate PLL for each transceiver is that noise contributions from the PLLs are uncorrelated. When digitally processing a combined signal from transceivers using separate PLLs, noise that is uncorrelated between the transceivers can be reduced by a factor of N, where N is the number of transceivers. Thus when using separate PLLs combined with beamforming, the signal to noise ratio (SNR) in the beam direction improves.

Beamforming requires a known phase relation between the signals at the antennas. When using multiple PLLs, phase alignment becomes more difficult to maintain. Several impairments inside the PLL, for example limited charge-pump output impedance and loop filter leakage, and the reference clock signal distribution into the different PLLs add to uncertainty in the phase relation between the PLLs.

Static errors in between the PLLs may be calibrated, but errors due to temperature drift and different temperature at different PLLs are more cumbersome to compensate. The temperature drift could be compensated by rerunning an antenna calibration algorithm, but this is normally a time and resource consuming task, which may involve interrupting ongoing transmission and reception.

There is a need for improved calibration method and system for multiple PLLs in a wireless communication device.

SUMMARY

Therefore it is an object of embodiments herein to provide a system and method for phase alignment of multiple PLLs in a wireless communication device.

According to one aspect of embodiments herein, the object is achieved by a system for phase alignment of multiple phase adjustable Phased Locked Loops, PLLs. The system comprises a plurality N of PLLs. Each PLL comprises an oscillator configured to generate a respective output signal, a frequency divider configured to generate a feedback signal by dividing the respective output signal, and a phase comparator arrangement configured to output a respective control signal to control the oscillator in response to a detection of a phase deviation between a reference signal and the feedback signal.

The system further comprises a plurality N of phase detectors. The plurality N of phase detectors and the plurality N of PLLs are connected in a loop such that an i-th phase detector is configured to receive an i-th feedback signal generated from the i-th PLL and an (i+1)-th feedback signal generated from the (i+1)-th PLL, and the N-th phase detector is configured to receive the first feedback signal generated from the first PLL and the N-th feedback signal generated from the N-th PLL. Further, the i-th phase detector is configured to generate an i-th adjustment signal indicating an i-th phase difference between the i-th and (i+1)-th feedback signals for adjusting a phase of the i-th or (i+1)-th PLL, and the N-th phase detector is configured to generate a N-th adjustment signal indicating a N-th phase difference between the first and N-th feedback signals, wherein $i=1, 2, 3, \ldots N-1$.

According to one aspect of embodiments herein, the object is achieved by a method in a system for phase alignment of multiple phase adjustable Phased Locked Loops, PLLs. The system generates a plurality N of output signals from a plurality N of PLLs and generates a plurality N of feedback signals by dividing the respective N output signals from the plurality N of PLLs. The system further generates a plurality N of adjustment signals from a plurality N of phase detectors. The system generates an i-th adjustment signal from an i-th phase detector, indicating an i-th phase difference between the i-th and (i+1)-th feedback signals. The system generates the N-th adjustment signal from the N-th phase detector, indicating an N-th phase difference between the first and N-th feedback signals.

Further the system adjusts a phase of the i-th or (i+1)-th PLL based on the i-th adjustment signal, wherein i=1, 2, 3, . . . N−1.

According to the embodiments herein, the feedback signals from two PLLs are compared in a phase detector to generate an adjustment signal. Any phase difference in between the two PLLs may be compensated by adjusting a phase of one of the PLLs, either charge-pump, time-to-digital converter or divider may be adjusted based on the adjustment signal to adjust the phase of the PLL. Since the plurality N phase detectors and PLLs are connected in a loop, this forms a slow closed loop calibration. In this way, an accumulation error, which arises often when calibrating multiple PLLs with each other, is reduced.

Further, since the temperature drift is a relatively slow process, this calibration may be run relatively infrequent, based on either elapsed time or a detected temperature drift.

Detection of phase errors in between PLLs on different RFICs may also be detected and corrected similarly. Errors in phase detectors or delays due to physical distances may cause the actual adjustment signal which indicates the phase difference in between the two PLL output signals not to be 0. However this is not important since this calibration may be run before the actual antenna calibration is run. Then the actual antenna calibration which is more complicated may be run, making sure that the actual signal phase at the antenna is correct. After this step the relative phase between the PLLs should be kept the same as in the first PLL phase alignment calibration.

Thus the system and method according to embodiments herein avoid frequent recalibration of antenna tuning. The calibration according to embodiments herein may run in background without interfering ongoing transmission and reception.

Further it may save power of the wireless communication device, since the PLLs may be shut down and restarted again without rerunning antenna calibration.

Thus, embodiments herein provide an improved system and method for phase alignment of multiple PLLs comprised in one or more RFICs in a wireless communication device.

BRIEF DESCRIPTION OF THE DRAWINGS

Examples of embodiments herein are described in more detail with reference to attached drawings in which.

DETAILED DESCRIPTION

As part of developing embodiments herein, simple explanations on components and their functions in a PLL will be given, and some problems related to the PLL will be identified and discussed.

Figure 1A:
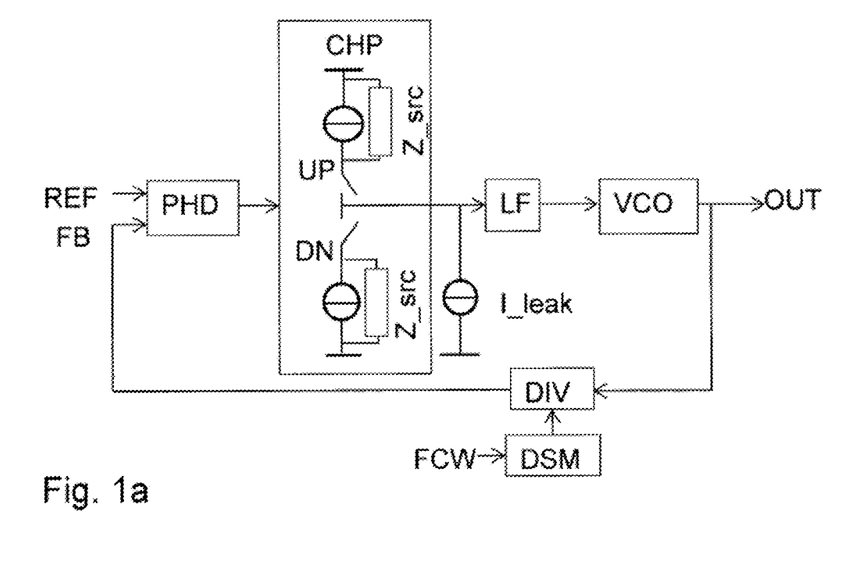
FIGS. 1a and 1b are general block views of PLLs according to prior art.
Figure 1B:
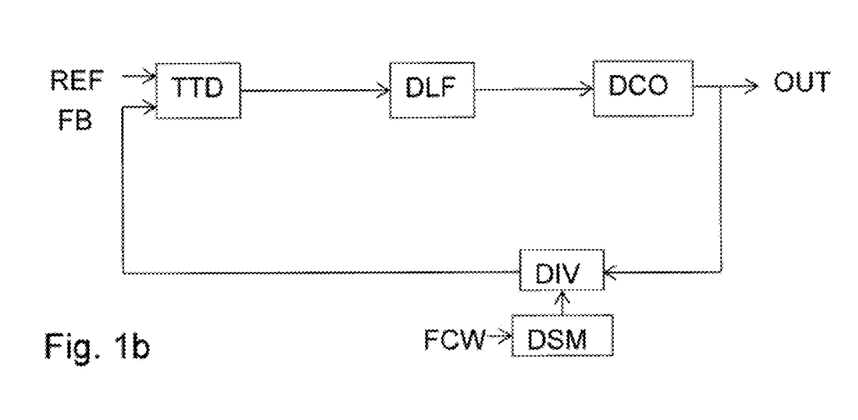

FIGS. 1a and 1b show general block views of two PLLs according to prior art, wherein FIG. 1a is an analog delta-sigma controlled fractional-N PLL and FIG. 1b is a digital PLL. As shown in FIG. 1a, the analog PLL comprises a phase detector PHD to receive a reference signal REF and a feedback signal FB and generate a signal indicating a phase difference between the signals REF and FB, a charge pump CHP which receives the signal from the PHD and generates a control signal, a loop filter LF to filter the control signal and a voltage controlled oscillator VCO to receive the filtered control signal. The analog PLL further comprises a delta-sigma modulator DSM which receives a frequency command word FCW and controls a divider DIV to make sure the average frequency of the output signal OUT from the PLL is x*REF, typically x is in the order of 10 to 100. The delta-sigma modulator adds a lot of jitter to the feedback signal FB which is low-pass filtered in the PLL loop filter LF. The loop filter LF generates a loop voltage to control the VCO based on the phase difference between the reference signal REF and the feedback signal FB. The FB signal is generated by dividing the output signal OUT from the VCO in the divider. The VCO is thus phase locked to the reference signal REF.

The digital PLL shown in FIG. 1b works in a similar way as the analog PLL does. The digital PLL comprises a time-to-digital converter TTD instead of the phase detector PHD and charge pump CHP. The digital PLL further comprises a digital loop filter DLF to generate digital control words to control a digital controlled oscillator DCO, instead of the analog LP to generate a control voltage to control the VCO.

The PHD, CHP and LP in the analog PLL, and the TTD, DLF in the digital PLL are refereed hereafter as a phase comparator arrangement, which is configured to output a control signal to control the oscillator in response to a detection of a phase deviation between the reference signal REF and the feedback signal FB.

The following discussions on impairments in the PLL will use the analog PLL shown in FIG. 1a as an example. Two impairments are shown in FIG. 1a. One is leakage in the loop filter LF, shown as I_leak. This generates an offset into the phase detector and thus a phase difference between the PLL output signal OUT and the reference signal REF.

Another impairment is mismatch in the charge-pump CHP output impedance. A difference between sink and source output impedance, shown as Z_snk, Z_src, will also impose a phase difference at the PLL input when the loop voltage varies.

Both these effects are strongly temperature dependent. The VCO drifts versus temperature and to maintain frequency lock, the PLL compensates this drift by varying the loop voltage. The phase difference at the PLL input is scaled with the PLL division ratio of the divider DIV, making the system very sensitive. Similar problems may happen on the digital PLL as well.

For a wireless communication device comprising one or more RFICs, each RFIC may comprise one or multiple PLLs. Each PLL may suffer these impairments and phase relation between two or all of PLLs may be uncertain. As discussed in the background, beamforming requires a known phase relation between the signals at the antennas. Further, phase errors due to temperature drift, different temperature at different PLLs and the reference clock signal distribution into the different PLLs add even more uncertainty in the phase relation between the PLLs. Phase alignments or calibration for the PLLs inside one RFIC and in-between different RFICs is thus necessary.

Figure 2:
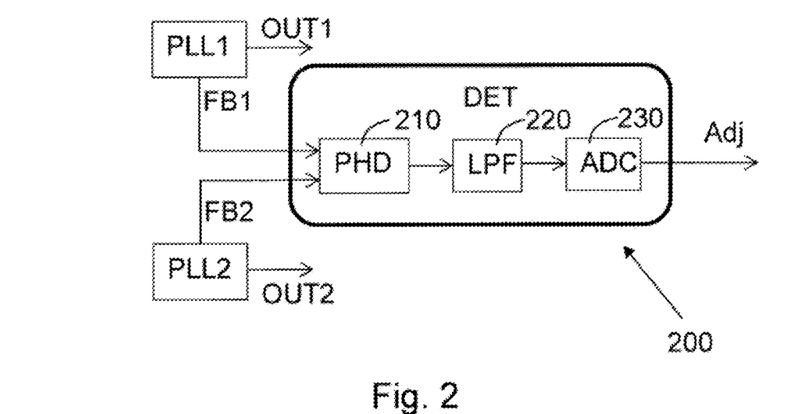
FIG. 2 is a schematic block view illustrating a system comprising two PLLs and a phase detector according to embodiments herein.

To align the phases between the PLLs, a technique according to embodiments herein is to utilize the divided VCO signals already available in the PLLs, i.e. the feedback signals FB in the PLLs. The PLL may be either analog or digital PLL, either an integer PLL or a delta-sigma controlled fractional-N PLLs. The divided VCO signal, as described above, is normally used in the PLL to phase-lock the VCO to a reference signal. FIG. 2 shows one example embodiment, denoted as a system 200, where two PLLs are shown. The FB signals FB1 and FB2 from the two PLLs, PLL 1 and PLL2, are pulled out and injected into a new phase detector PHD 210. An output of the phase detector PHD 210 may be low pass filtered by a LPF 220 to suppress high frequency noise generated by the DSM. The low pass filtered signal of the output of the PHD 210 is a measure of the relative phase difference in between the two PLLs output signals OUT1, OUT2. The magnitude of the phase difference may be measured using a slow analog-to-digital converter ADC 230 and an adjustment signal is generated Adj. Then the phase correction or calibration may be made in one of the PLLs, for example by adjusting the charge pump, the time-to-digital converter, or the frequency divider in the PLL based on the adjustment signal Adj.

The calibration is made in between all PLLs. It's important to make sure that errors are not accumulated due to calibrating a lot of PLLs in series. Comparing one of the PLLs to all the other should minimize this effect, but adds a lot of routing overhead.

Figure 3:
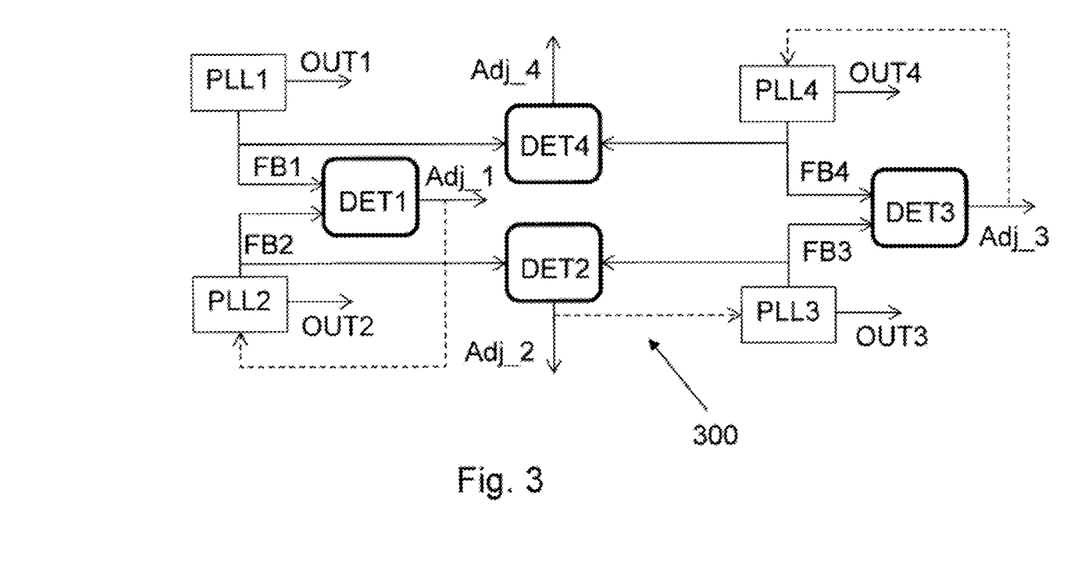
FIG. 3 is a schematic block view illustrating a system comprising 4 PLLs according to embodiments herein.

To minimize the error accumulation, some of the PLLs may also be compared in a loop. FIG. 3 shows an example of this kind of calibration loop, denoted as a system 300, where 4 PLLs, PLL1, . . . PLL4 are involved and 4 phase detectors are used. As shown in FIG. 3, feedback signals from the first and second PLLs, FB1 and FB2, are compared in a first phase detector DET1 and first adjustment signal Adj_1 is generated, feedback signals from the second and third PLLs, FB2 and FB3, are compared in a second phase detector DET2 and a second adjustment signal Adj_2 is generated, feedback signals from the third and fourth PLLs, FB3 and FB4, are compared in a third phase detector DET3 and a third adjustment signal Adj_3 is generated, and finally, feedback signals from the first and fourth PLLs, FB1 and FB4, are compared in a fourth phase detector DET4 and a fourth adjustment signal Adj_4 is generated.

The adjustment signals Adj_1, . . . Adj_4 from all phase detectors DET1-DET4 may be used to adjust the phases of the PLLs. In this case, if for example using PLL1 as reference, then the phase of PLL2 may be corrected based on Adj_1, then correcting PLL3 based on Adj_2, and finally correcting PLL4 based on Adj_3. DET4 should in theory give zero reading if adjusting PLL2-4 to be phase aligned with PLL1. However if the corrections in PLL 2-4 each introduces a small error, DET4 might give a non-zero reading. If so, this residual error should be distributed and compensated in PLL2-4 such that each detector DET1-4 generates the same residual error. This may be done by adding a small offset to each correction in PLL2, PLL3 and PLL4. For example, the offset may be the DET4 reading divided by 3 in this case.

Figure 4:
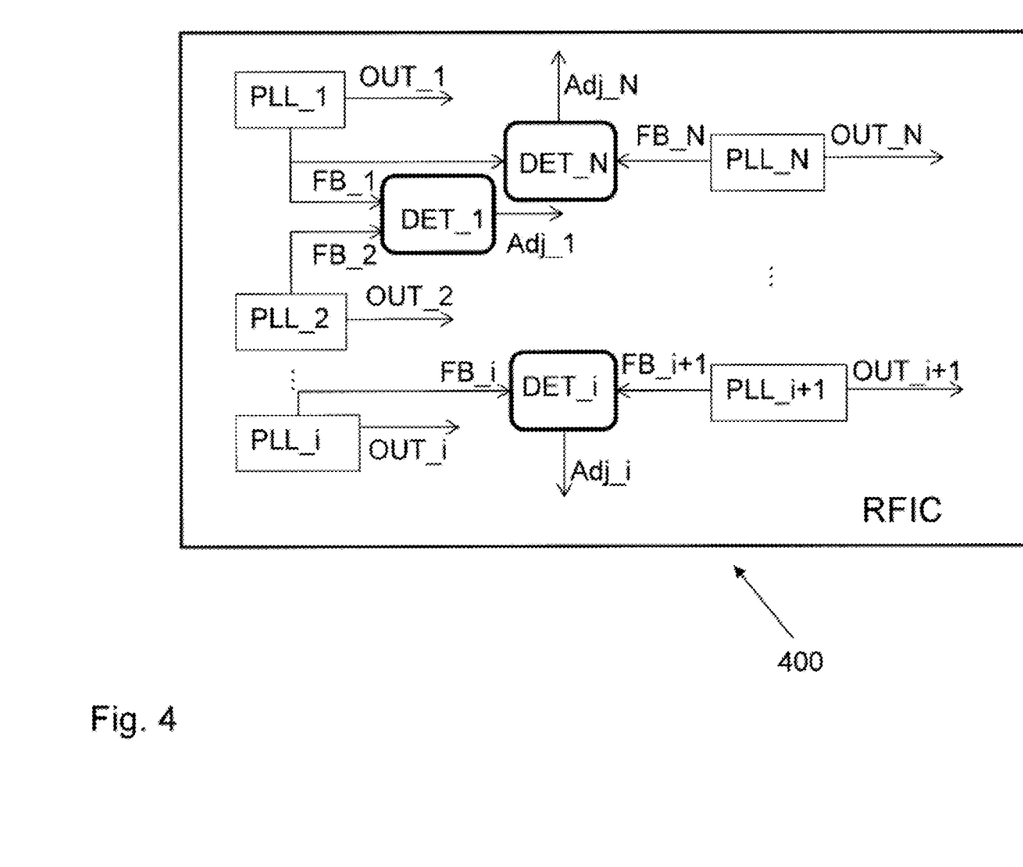
FIG. 4 is a schematic block view illustrating a system comprising a plurality N of PLLs according to embodiments herein.

In practice, more than 4 PLLs may be involved. FIG. 4 shows a system 400, where a plurality N of PLLs are involved. As shown in FIG. 4, the system comprises a plurality N of PLLs. Each PLL, either analog or digital PLL, either an integer PLL or a delta-sigma controlled fractional-N PLLs, may comprise, with reference to FIGS. 1a and 1b, an oscillator, either VCO or DCO, configured to generate a respective output signal OUT_1, . . . OUT_N; a frequency divider DIV configured to generate a respective feedback signal FB_1, . . . FB_N by dividing the respective output signal OUT_1, . . . OUT_N; a phase comparator arrangement configured to output a respective control signal to control the oscillator in response to a detection of a phase deviation between a common reference signal REF and the feedback signal FB. The phase comparator arrangement may comprise a phase detector, a charge pump and a loop filter in an analog PLL, or a time-to-digital converter and a digital loop filter in a digital PLL.

The system further comprises a plurality N of phase detectors DET_1 . . . DET_N. The plurality N of phase detectors DET_1 . . . DET_N and the plurality N of PLLs PLL_1 . . . PLL_N are connected in a loop such that an i-th phase detector DET_i is connected to i-th and (i+1)-th PLLs and configured to receive an i-th feedback signal generated from the i-th PLL and an (i+1)-th feedback signal generated from the (i+1)-th PLL, wherein i=1, 2, 3, . . . N−1. The i-th phase detector DET_i is configured to generate an i-th adjustment signal Adj_i indicating an i-th phase difference between the i-th and (i+1)-th feedback signals for adjusting a phase of the i-th or (i+1)-th PLL. Further, the N-th phase detector DET_N is connected to the 1st and N-th PLLs and configured to receive the first feedback signal FB1 generated from the first PLL PLL_1 and the N-th feedback signal FB_N generated from the N-th PLL PLL_N. The N-th phase detector DET_N is configured to generate a N-th adjustment signal Adj_N indicating a N-th phase difference between the first and N-th feedback signals.

According to some embodiments herein, the plurality N of PLLs and the plurality N of phase detectors may be comprised in one Radio Frequency Integrated Circuit, RFIC, as shown in FIG. 4.

Figure 5:
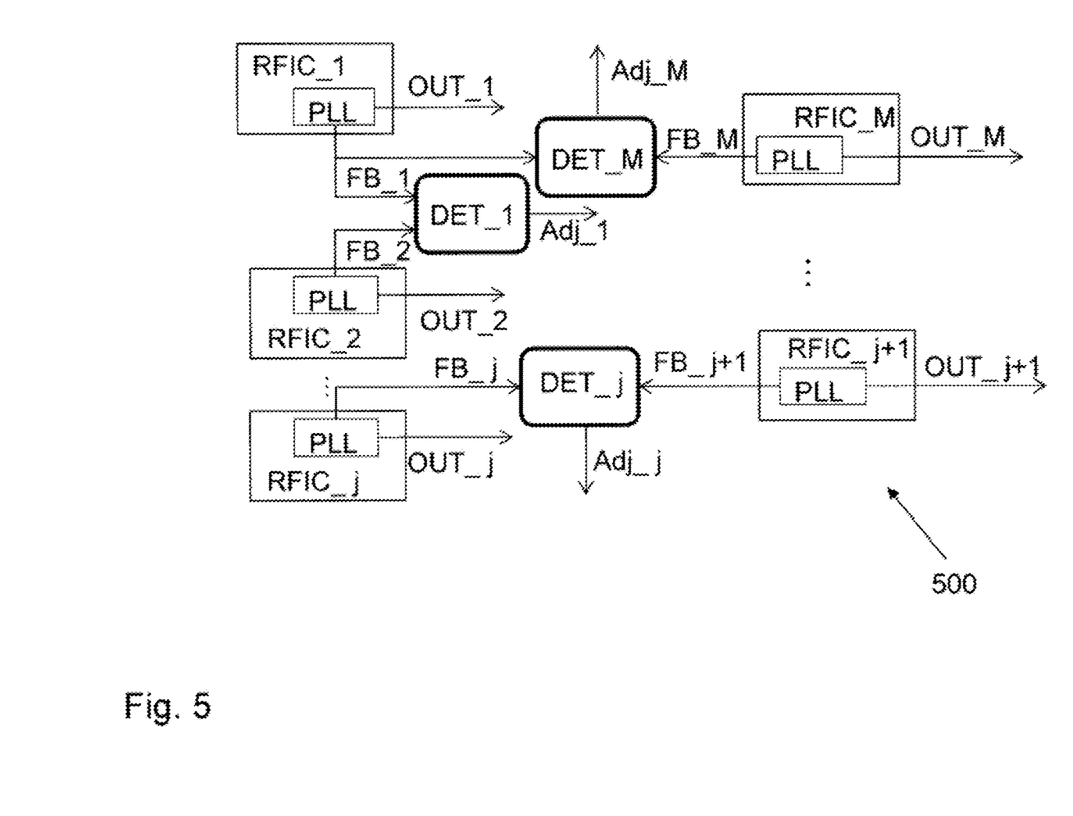
FIG. 5 is a schematic block view illustrating a system comprising a plurality M of RFICs according to embodiments herein.

According to some embodiments herein, more than one RFICs are involved and each RFIC may comprise one or more PLLs. Then it may be considered to have one calibration loop for the PLLs within each RFIC as shown in FIG. 4 and another calibration loop where one PLL from each RFIC is included. FIG. 5 shows a system 500, where a plurality M of RFICs are comprised in the system 500, each RFIC may comprise one or more PLLs. The system 500 further comprises a plurality M of phase detectors DET_1 . . . DET_M. The plurality M of phase detectors and one PLL from each RFIC are connected in a loop such that a j-th phase detector DET_j is connected to one PLL in the j-th RFIC and one PLL in the (j+1)-th RFIC, wherein j=1, 2, 3, . . . M−1. The j-th phase detector DET_j is configured to receive a j-th feedback signal generated from the PLL in the j-th RFIC and a (j+1)-th feedback signal generated from the PLL in the (j+1)-th RFIC. The j-th phase detector DET_j is further configured to generate a j-th adjustment signal Adj_j indicating a j-th phase difference between the j-th and (j+1)-th feedback signals for adjusting a phase of one PLL in the j-th or (j+1)-th RFIC. Further, the M-th phase detector DET_M is connected to one PLL in the first RFIC and one PLL in the M-th RFIC and configured to receive the first feedback signal generated from the PLL in the first RFIC and the M-th feedback signal generated from the PLL in the M-th RFIC. The M-th phase detector DET_M is configured to generate an M-th adjustment signal Adj_M indicating an M-th phase difference between the first and M-th feedback signals.

In this way, detection of phase errors in between PLLs on different RFICs may be detected and corrected similarly as on-chip phase errors in between the PLLs on one RFIC. In these embodiments, the divided output signal from the PLLs are sent in between different RFIC chips, and the phase detector DET_1 ... DET_M may be implemented on the same RFIC as any one of the two PLLs it connected to.

When phase differences are detected between two PLLs, a phase of any one of the PLLs may be adjusted by adjusting the charge pump, the time-to-digital converter, or the frequency divider in the PLL. Therefore, according to some embodiments herein, the phase comparator arrangement in each PLL may comprise either an adjustable charge pump or a time-to-digital converter. For the calibration loop involving the PLLs on one RFIC, the adjustable charge pump or the time-to-digital converter in the (i+1)-th PLL may be configured to receive the i-th adjustment signal Adj_i and adjust its output based on the i-th adjustment signal, wherein i=1, 2, 3, ... N−1. Alternatively, the frequency divider in the (i+1)-th PLL may be configured to receive the i-th adjustment signal Adj_i and adjust its division ratio based on the i-th adjustment signal, wherein i=1, 2, 3, ... N−1.

According to some embodiments herein, for the calibration loop involving the PLLs in more than one RFIC, the adjustable charge pump or the time-to-digital converter in the PLL in the (j+1)-th RFIC may be configured to receive the j-th adjustment signal Adj_j and adjust its output based on the j-th adjustment signal, wherein j=1, 2, 3, ... M−1. Alternatively, the frequency divider in the PLL in the (j+1)-th RFIC may be configured to receive the j-th adjustment signal Adj_j and adjust its division ratio based on the j-th adjustment signal, wherein j=1, 2, 3, ... M−1.

According to some embodiments herein, each of the phase detectors DET_1, DET_i, DET_N, DET_j, DET_M may comprise a low-pass filter 220 to suppress high frequency noise, an analog-to-digital converter 230 to measure a magnitude of the phase difference.

Errors in phase detectors or delays due to physical distances may cause the actual adjustment signal which indicates the phase difference in between the two PLL output signals not to be 0. However this is not important since the calibrations in between PLLs on the same RFIC and in between PLLs on different RFICs may be run before the actual antenna calibration is run. Then the actual antenna calibration which is more complicated may be run, making sure that the actual signal phase at the antenna is correct. It may be more important to keep the relative phase between the PLLs constant or the same as in the first PLL phase alignment calibration. Therefore according to some embodiments herein, the charge pump, the time-to-digital converter or the divider are adjusted such that the i-th and j-th phase differences are close to zero or kept constant, wherein i=1, 2, 3, ... N, j=1, 2, 3, ... M.

Figure 6:
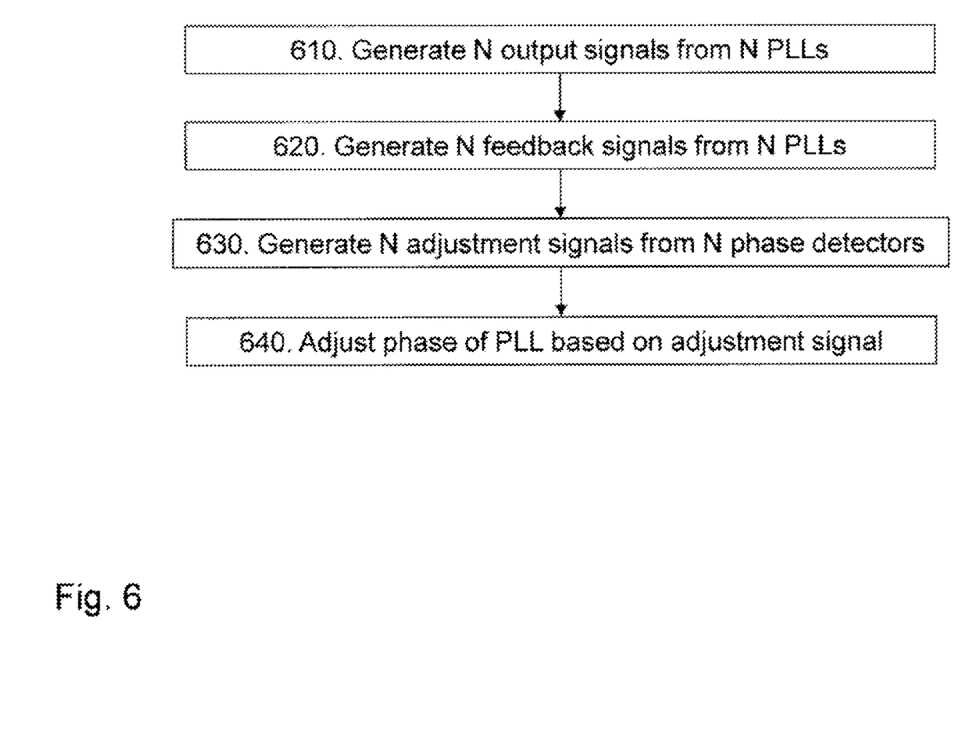
FIG. 6 is flow chart illustrating a method according to embodiments herein.

Corresponding embodiment of a method in a system for phase alignment of multiple PLLs will now be described with reference to FIG. 6. As mentioned above, the system comprises a plurality of PLLs and a plurality of phase detectors, and the plurality of PLLs and phase detectors are connected in a loop. The method comprises the following actions.

Action 610

The system generates a plurality N of output signals from a plurality N of PLLs.

Action 620

The systems generates a plurality N of feedback signals by dividing the respective N output signals from the plurality N of PLLs.

Action 630

The systems generates a plurality N of adjustment signals from a plurality N of phase detectors. The i-th adjustment signal is generated from an i-th phase detector, indicating an i-th phase difference between the i-th and (i+1)-th feedback signals, and the N-th adjustment signal is generated from the N_th phase detector, indicating an N-th phase difference between the first and N-th feedback signals, wherein i=1, 2, 3, ... N−1.

Action 640

When phase differences are detected between two PLLs, the phase of any one of the PLLs may be adjusted. Therefore the systems may adjust a phase of the i-th or (i+1)-th PLL based on the i-th adjustment signal, wherein i=1, 2, 3, ... N−1.

The phase of the i-th or (i+1)_th PLL may be adjusted by adjusting any one of a charge pump, a time-to digital converter, or a frequency divider in the PLL based on the adjustment signal.

If each correction introduces an error, the N-th detector DET_N may not give correct reading. If so, this may be compensated by adding a small offset to each correction in PLL_2, PLL_3, ... , PLL_N. For example, the offset may be the DET_N reading divided by N−1. Therefore according to some embodiments, the system may add an offset to each phase correction in the PLLs based on the N-th adjustment signal, wherein i=1, 2, 3, ... N−1.

The above method Actions 610-640 may be used to phase alignment of multiple PLLs comprised in one RFIC, or to phase alignment of multiple PLLs comprised in more than one RFICs. Corresponding method in a system 500, as shown in FIG. 5, for phase alignment of multiple PLLs comprised in more than one RFICs will now be described with reference to FIG. 7. As mentioned above, the system 500 comprises a plurality M of RFICs, each RFIC may comprise one or more PLLs. The method comprises the following actions:

Action 710

Figure 7:
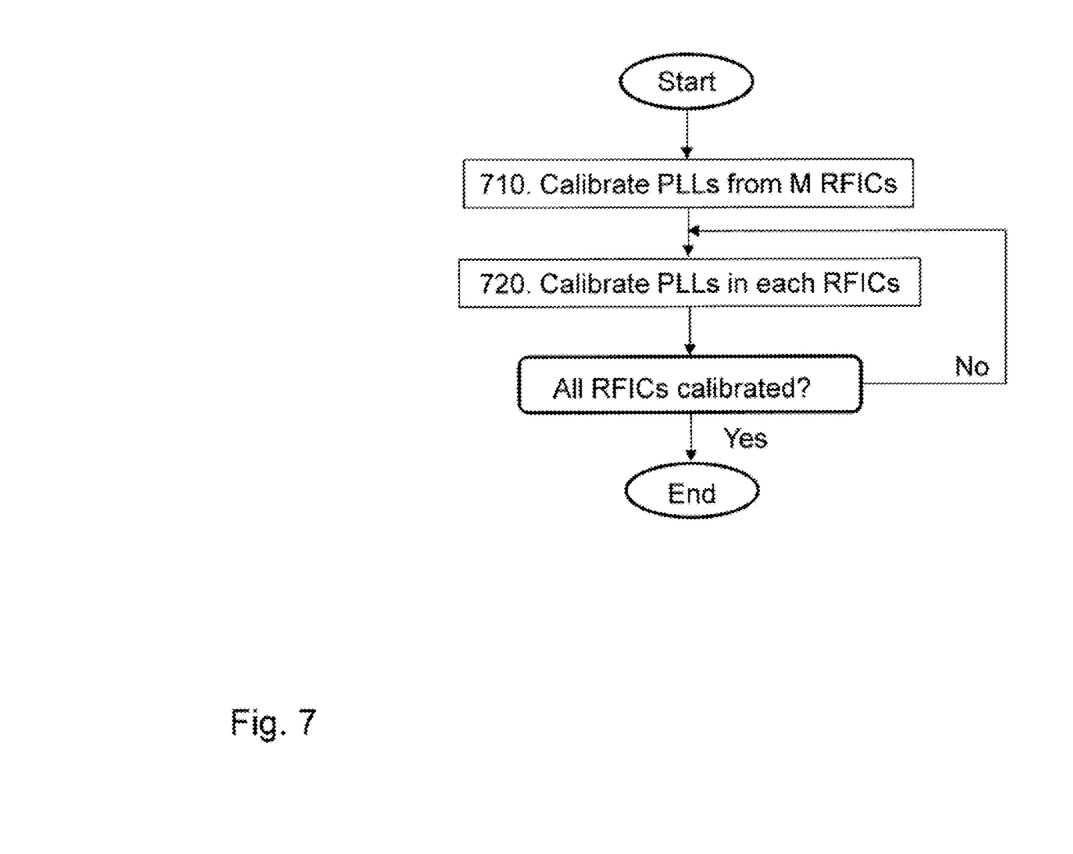
FIG. 7 is a block diagram illustrating a communication device in which embodiments herein may be implemented.

The system calibrates multiple PLLs between each RFICs. A calibration loop is set up where one PLL from each RFICs is included, as shown and discussed above with reference to FIG. 5. The system 500 comprises a plurality M of phase detectors DET_1 ... DET_M. The plurality M of phase detectors and one PLL from each RFIC are connected in a loop to form the calibration loop as described above. Then the calibrating process follows Actions 610-640 described above. Since a plurality M of PLLs are involved, where the plurality N in Actions 610-640 should be replaced by a plurality M.

Action 720

The system calibrates multiple PLLs inside each RFIC. A calibration loop is set up for the PLLs within each RFIC, as shown in FIG. 4. Then the calibrating process follows Actions 610-640. The calibrating will run for a plurality N of PLLs in each RFIC until all M RFICs are calibrated. That is, the plurality N of PLLs in j-th RFIC and a plurality N of phase detectors are connected in a loop to form a j-th calibration loop, and the calibrating runs for j-th RFIC, where j=1, 2, ... M.

To summarise the discussions above, some advantages of the system 200, 300, 400, 500 according to embodiments include: using available hardware, e.g. dividers in the PLLs to a large extent for calibration of the phases in between PLLs; relaxing the need for frequent antenna recalibration and enabling the use of individual PLLs for each transceiver; avoiding frequent recalibration of antenna tuning; running the calibration in background without interfering ongoing transmission and reception; much simpler calibration than antenna calibration; saving power by shutting down PLLs and restarting them again without rerunning antenna calibration; minimizing accumulation error by forming a closed loop calibration; the calibration may be run relatively infrequent, based on either elapsed time or a detected temperature drift since the temperature drift is a relatively slow process.

Figure 8:
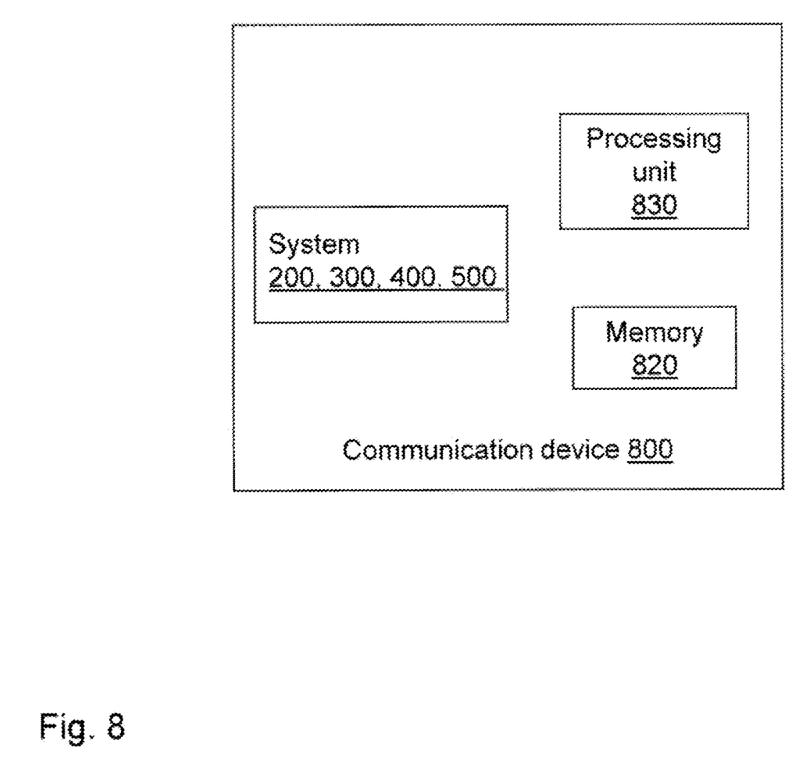

The system 200, 300, 400, 500 according to embodiments herein is suitable for phase alignment of multiple PLLs in a wireless communication device, or for any electronic devices which comprise multiple PLLs. FIG. 8 shows a communication device 800 in which the system 200, 300, 400, 500 according to embodiments herein may be implemented. The communication device 800 may be any one of a base station or beamforming base station, a mobile terminal or a user equipment, a transceiver, a transmitter, a receiver etc. The communication device 800 may comprise other units, e.g. a memory 820 and a processing unit 830 for information storage and signal processing etc.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appending claims.

Also note that terminology such as a first PLL and a second PLL should be considered to be non-limiting and does in particular not imply a certain hierarchical relation between the two.

The invention claimed is:

1. A system for phase alignment of three or more phase adjustable Phased Locked Loops (PLLs), the system comprising:
   a plurality N of PLLs, wherein N≥3 and each PLL comprises:
      an oscillator configured to generate a respective output signal;
      a frequency divider configured to generate a respective feedback signal by dividing the respective output signal;
      a phase comparator arrangement configured to output a respective control signal to control the oscillator in response to a detection of a phase deviation between a reference signal and the feedback signal;
   a plurality N of phase detectors, wherein successive ones of the plurality N of PLLs are connected, to each of the plurality N of phase detectors, in a loop such that:
      an i-th phase detector is configured to receive an i-th feedback signal generated from the i-th PLL and an (i+1)-th feedback signal generated from the (i+1)-th PLL, wherein i=1, 2, 3, . . . N−1; and
      the N-th phase detector is configured to receive the first feedback signal generated from the first PLL and the N-th feedback signal generated from the N-th PLL;
   wherein the i-th phase detector is configured to generate an i-th adjustment signal indicating an i-th phase difference between the i-th and (i+1)-th feedback signals for adjusting a phase of the i-th or (i+1)-th PLL;
   wherein the N-th phase detector is configured to generate a N-th adjustment signal indicating a N-th phase difference between the first and N-th feedback signal; and
   wherein no phase detector receives feedback signals from the same two PLLs.

2. The system of claim 1, wherein the plurality N of PLLs and the plurality N of phase detectors are comprised in one Radio Frequency Integrated Circuit (RFIC).

3. The system of claim 1:
   wherein the system further comprises a plurality M of Radio Frequency Integrated Circuit (RFICs), and each RFIC comprises one or more PLLs;
   wherein the system further comprises a plurality M of phase detectors, wherein the plurality M of phase detectors and one PLL from each RFIC are connected in a loop such that:
      a j-th phase detector is configured to:
         receive a j-th feedback signal generated from one PLL in the j-th RFIC and a (j+1)-th feedback signal generated from one PLL in the (j+1)-th RFIC; and
         generate a j-th adjustment signal indicating a j-th phase difference between the j-th and (j+1)-th feedback signals for adjusting a phase of the PLL in the j-th or (j+1)-th RFIC, wherein j=1, 2, 3, . . . M−1; and
      the M-th phase detector is configured to:
         receive the first feedback signal generated from one PLL in the first RFIC and the M-th feedback signal generated from one PLL in the M-th RFIC; and
         generate an M-th adjustment signal indicating an M-th phase difference between the first and M-th feedback signals.

4. The system of claim 3, wherein:
   the phase comparator arrangement in each PLL comprises either an adjustable charge pump or a time-to-digital converter; and
   the adjustable charge pump or the time-to-digital converter in the PLL in the (j+1)-th RFIC is configured to receive the j-th adjustment signal and adjust its output based on the j-th adjustment signal, wherein j=1, 2, 3, . . . M−1.

5. The system of claim 3, wherein the frequency divider in the PLL in the (j+1)-th RFIC is configured to receive the j-th adjustment signal and adjust its division ratio based on the j-th adjustment signal, wherein j=1, 2, 3, . . . M−1.

6. The system of claim 1, wherein:
   the phase comparator arrangement in each PLL comprises either an adjustable charge pump or a time-to-digital converter; and
   the adjustable charge pump or the time-to-digital converter in the (i+1)-th PLL is configured to receive the i-th adjustment signal and adjust its output based on the i-th adjustment signal, wherein i=1, 2, 3, . . . N−1.

7. The system of claim 6, wherein the charge pump, the time-to-digital converter, or the divider are adjusted such that the i-th and j-th phase differences are close to zero or kept constant, wherein i=1, 2, 3, . . . N, j=1, 2, 3, . . . M.

8. The system of claim 1, wherein the frequency divider in the (i+1)-th PLL is configured to receive the i-th adjustment signal and adjust its division ratio based on the i-th adjustment signal, wherein i=1, 2, 3, . . . N−1.

9. The system of claim 1, wherein each of the phase detectors comprises a low-pass filter.

10. The system of claim 1, wherein each of the phase detectors comprises an analog-to-digital converter.

11. A communication device, comprising
   a system for phase alignment of three or more phase adjustable Phased Locked Loops (PLLs), the system comprising:
      a plurality N of PLLs, wherein N≥3 and each PLL comprises:
         an oscillator configured to generate a respective output signal;

a frequency divider configured to generate a respective feedback signal by dividing the respective output signal; and a phase comparator arrangement configured to output a respective control signal to control the oscillator in response to a detection of a phase deviation between a reference signal and the feedback signal;

a plurality N of phase detectors, wherein successive ones of the plurality N of PLLs are connected, to each of the plurality N of phase detectors, in a loop such that:

an i-th phase detector is configured to receive an i-th feedback signal generated from the i-th PLL and an (i+1)-th feedback signal generated from the (i+1)-th PLL, wherein i=1, 2, 3, . . . N−1;

the N-th phase detector is configured to receive the first feedback signal generated from the first PLL and the N-th feedback signal generated from the N-th PLL;

wherein the i-th phase detector is configured to generate an i-th adjustment signal indicating an i-th phase difference between the i-th and (i+1)-th feedback signals for adjusting a phase of the i-th or (i+1)-th PLL;

wherein the N-th phase detector is configured to generate a N-th adjustment signal indicating a N-th phase difference between the first and N-th feedback signal; and wherein no phase detector receives feedback signals from the same two PLLs.

12. The communication device of claim 11, wherein the communication device is a base station, a mobile terminal, a user equipment, a transceiver, a transmitter, or a receiver.

13. A method in a system for phase alignment of three or more phase adjustable Phased Locked Loops (PLLs), the method comprising:

generating a plurality N of output signals from a plurality N of PLLs, wherein N≥3;

generating a plurality N of feedback signals by dividing the respective N output signals from the plurality N of PLLs;

generating a plurality N of adjustment signals from a plurality N of phase detectors, wherein:

an i-th adjustment signal is generated from an i-th phase detector, indicating an i-th phase difference between the i-th and (i+1)-th feedback signals;

the N-th adjustment signal is generated from the N-th phase detector, indicating an N-th phase difference between the first and N-th feedback signals; and wherein no phase detector receives feedback signals from the same two PLLs; and adjusting a phase of the i-th or (i+1)-th PLL based on the i-th adjustment signal; wherein i=1, 2, 3, . . . N−1.

14. The method of claim 13, further comprising adding an offset to each phase correction in the PLL based on the N-th adjustment signal.

15. The method of claim 13, wherein the adjusting the phase of the i-th or (i+1)-th PLL comprises adjusting any one of a charge pump, a time-to digital converter, or a frequency divider in the PLL based on the adjustment signal.

16. A method in a system for phase alignment of three or more phase adjustable Phased Locked Loops (PLLs), wherein the system comprises a plurality M of Radio Frequency Integrated Circuit (RFICs), each RFIC comprises one or more PLLs, and at least one RFIC comprises at least two PLLs, the method comprising:

calibrating multiple PLLs from the plurality M of RFICs using the method of claim 13, wherein one PLL from each of two successive RFIC is connected to each of a plurality M of phase detectors in a loop to form a calibration loop;

calibrating multiple PLLs in j-th RFIC using the method of claim 13, wherein successive ones of a plurality N of PLLs in j-th RFIC are connected to each of a plurality N of phase detectors in a loop to form a j-th calibration loop, wherein j=1, 2, 3, . . . M.

* * * * *